United States Patent [19]
Chien

[11] Patent Number: 5,871,271
[45] Date of Patent: Feb. 16, 1999

[54] LED ILLUMINATED PROTECTIVE HEADWEAR

[76] Inventor: Tseng Lu Chien, 8F, No. 29, Alley 73, Lin-Shen Street, Shi-Chi Town, Taipei, Hsong, Taiwan

[21] Appl. No.: 566,436

[22] Filed: Nov. 30, 1995

[51] Int. Cl.$^6$ ...................................................... F21L 15/14
[52] U.S. Cl. .......................... 362/106; 362/103; 362/105; 362/800
[58] Field of Search ................................... 362/105, 106, 362/103, 800, 72

[56] References Cited

U.S. PATENT DOCUMENTS

| | | | |
|---|---|---|---|
| 2,572,760 | 10/1951 | Rikelman | 36/1 |
| 2,907,249 | 10/1959 | Hjermstad | 88/78 |
| 3,513,305 | 5/1970 | Joncas | 240/9.5 |
| 3,694,945 | 10/1972 | Detiker | 40/133 R |
| 4,231,079 | 10/1980 | Heminover | 362/106 |
| 4,319,308 | 3/1982 | Ippoliti et al. | 362/106 |
| 4,559,516 | 12/1985 | Schott et al. | 362/106 |
| 4,559,586 | 12/1985 | Slarve | 362/106 |
| 4,848,009 | 7/1989 | Rodgers | 36/137 |
| 4,891,736 | 1/1990 | Gouda | 362/105 |
| 4,901,211 | 2/1990 | Shen | 362/106 |
| 4,999,747 | 3/1991 | Chen | 362/105 |
| 5,083,246 | 1/1992 | Lambert | 362/106 |
| 5,084,804 | 1/1992 | Schairer | 362/800 |
| 5,111,366 | 5/1992 | Ku | 362/106 |
| 5,327,587 | 7/1994 | Hurwitz | 2/422 |
| 5,327,588 | 7/1994 | Garneau | 362/105 |
| 5,329,637 | 7/1994 | Walker | 362/106 |
| 5,353,008 | 10/1994 | Eikenberry et al. | 362/72 |
| 5,357,409 | 10/1994 | Glatt | 362/105 |
| 5,406,724 | 4/1995 | Lin | 36/137 |
| 5,416,675 | 5/1995 | DeBeaux | 362/106 |
| 5,426,792 | 6/1995 | Murasko | 362/105 |
| 5,508,900 | 4/1996 | Norman | 362/106 |
| 5,510,961 | 4/1996 | Peng | 362/105 |
| 5,544,027 | 8/1996 | Orsano | 362/800 |
| 5,559,680 | 9/1996 | Tabanera | 362/106 |
| 5,588,736 | 12/1996 | Shea, Sr. | 362/106 |

*Primary Examiner*—Sandra L. O'Shea
*Assistant Examiner*—Matthew J. Spark
*Attorney, Agent, or Firm*—Bacon & Thomas

[57] ABSTRACT

Protective headwear having at least a hard-shell outer layer and a protective shock absorbing layer includes at least one LED illumination arrangement fitted into recesses in the protective layer and visible through an at least partially transparent area of the hardtop shell in any desired pattern or combination of lighting elements, the illumination arrangement including an optical member which serves to optically increase the viewing angle and at the same time deflect or distribute the force of impacts away from the LED and thereby decrease possible of LED penetration through the helmet and into the head of the wearer. A control circuit in the form of a multiple function integrated circuit controller in which the on/off times and sequences for individual LEDs is switchable, either by means of switches which can be operated by the wearer of the helmet, or during assembly by means of simple circuit components connected to appropriate input pins of the controller, so as to achieve any desired combination of special effects.

20 Claims, 9 Drawing Sheets

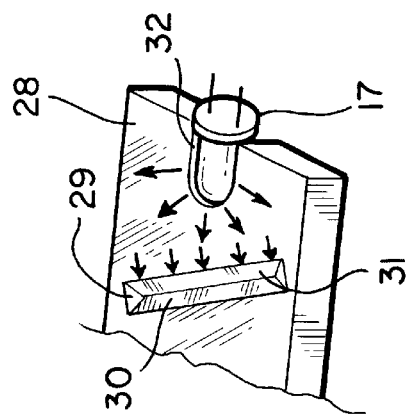
FIG. 4B
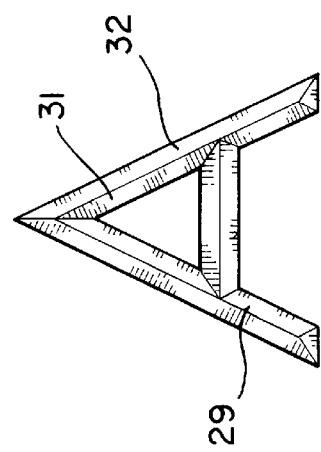
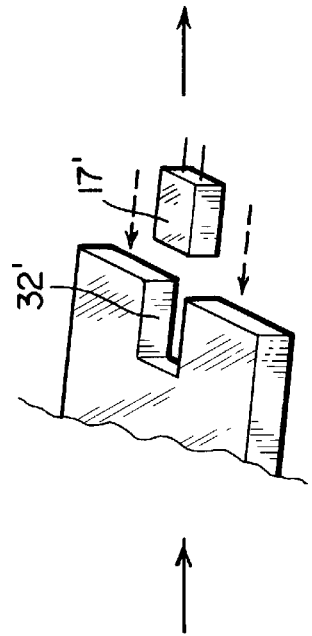
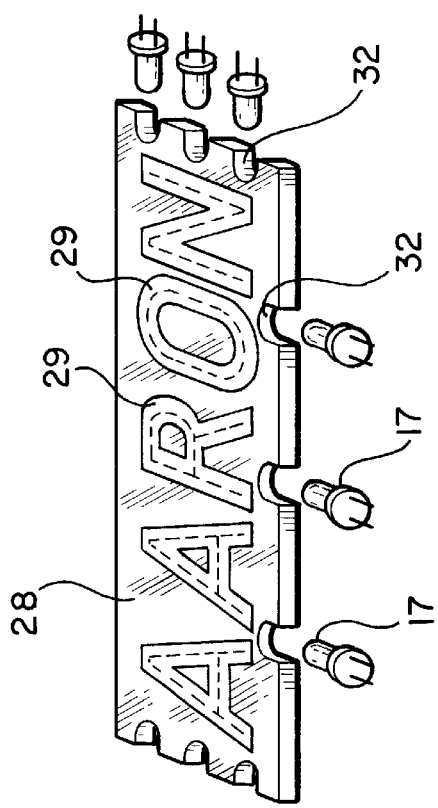
FIG. 4
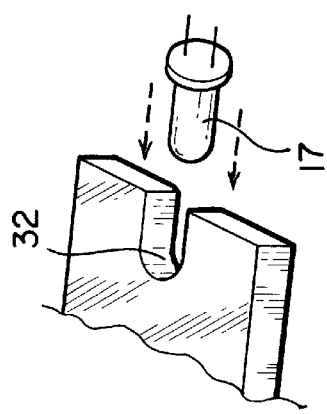
FIG. 4A

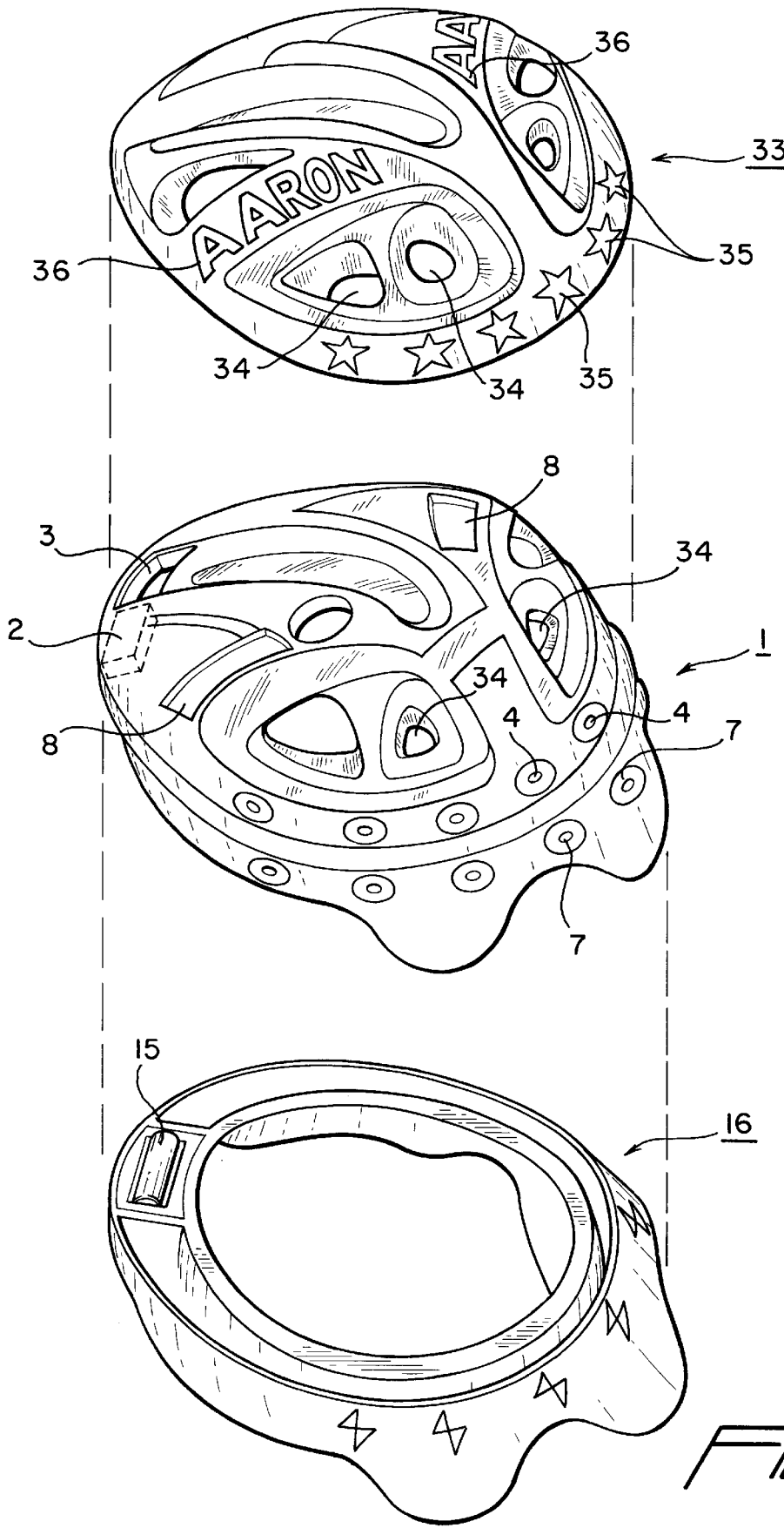

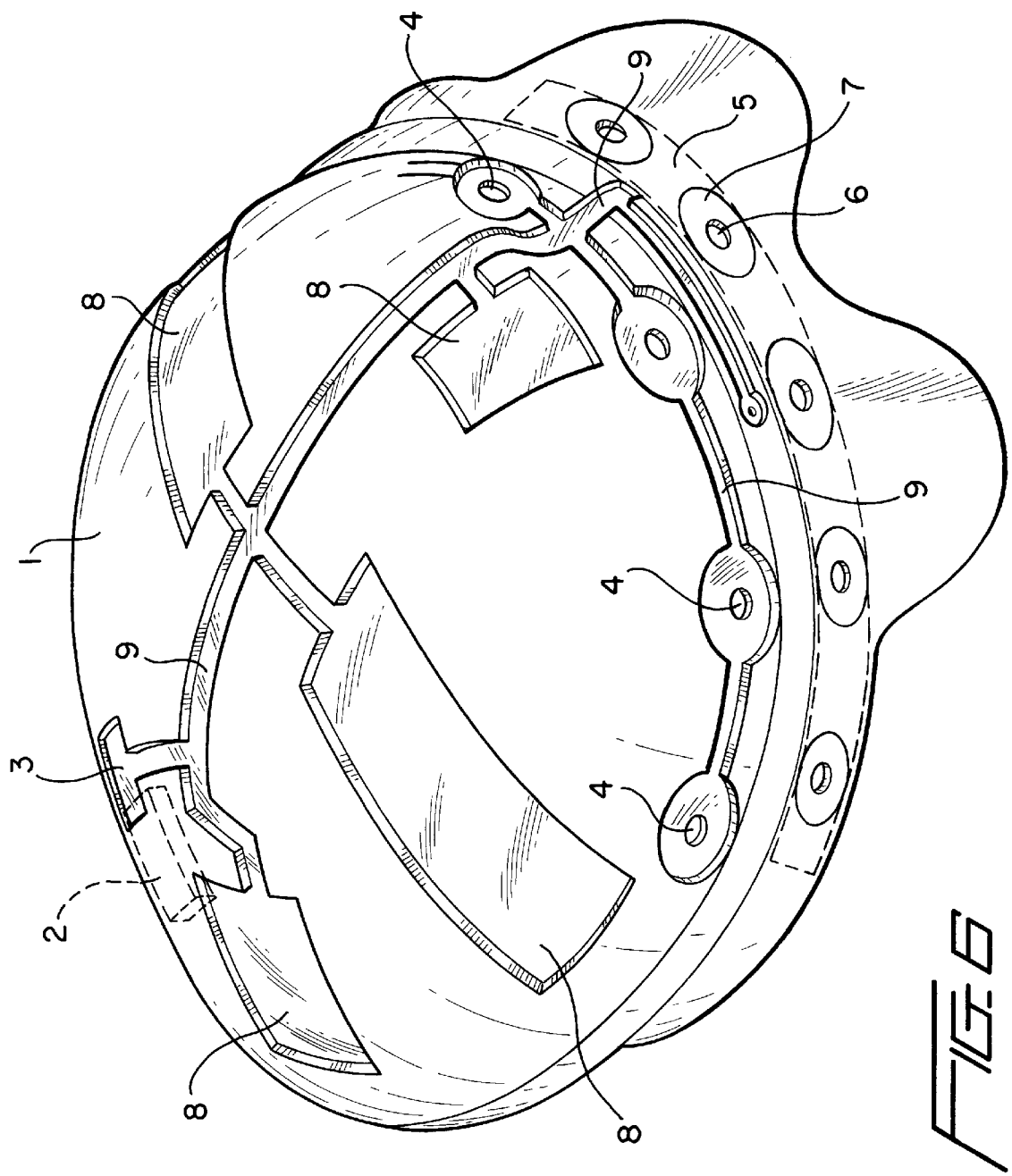

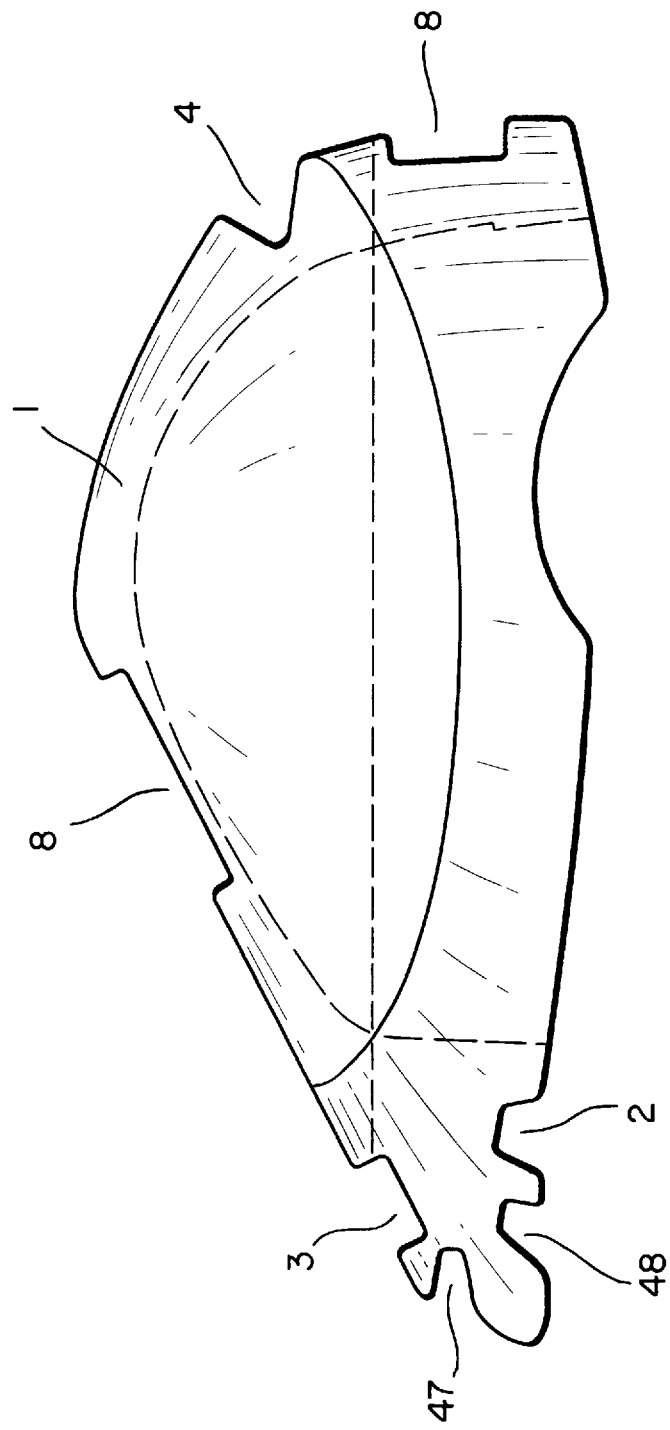

LED ILLUMINATED PROTECTIVE HEADWEAR

BACKGROUND OF THE INVENTION

1. Field of the Invention

This invention relates to protective headwear of the type designed to protect the head of the wearer by deflecting, distributing, or absorbing forces which would otherwise cause injury, and in particular to a helmet or hard hat illuminated by a plurality of light emitting diodes (LEDs).

2. Discussion of Related Art

The use of LEDs for illumination of protective headwear (including both helmets and hard hats) is known from a number of prior patents. However, while LEDs are relatively inexpensive in comparison with other types of lighting elements, such as electro-luminescent panels, conventional LED lighting arrangements present an number of problems in the context of protective headwear. These problems including difficulties in assembling the lighting arrangement to the headwear, making mass production at an acceptable cost impractical, and the potential for injuries caused by penetration of the LEDs into the head of the wearer during an impact. In addition, LEDs have a relatively narrow viewing angle in comparison with incandescent and electro-luminescent lighting elements, and thus are at present of limited utility for night time helmet applications where the goal is to make the wearer more visible to motorists and others.

U.S. Pat. No. 4,231,079, for example, discloses an illumination arrangement for a hard hat in which a plurality of LEDs are arranged in a single layer. The arrangement disclosed in this patent has a number of disadvantages common to all conventional lighting arrangements involving LEDs, including a relatively narrow viewing angle, limited display patterns, and relatively difficult assembly to the hard hat, particularly if area wide lighting is desired, such as might be the case if the lighting arrangement is used for advertising or promotional purposes. In addition, the LEDs present a serious risk of injury to the wearer of the hard hat because they could, during an impact, penetrate the head of the wearer, which could cause a terrible brain injury.

Another example of a prior art illuminated protective headwear arrangement, in this case a motorcycle helmet utilizing LEDs, is disclosed in U.S. Pat. No. 4,901,210. Like the arrangement described in the above-mentioned U.S. Pat. No. 4,231,079, the arrangement described in this patent has the visibility disadvantages of conventional LED arrangements and also has the disadvantage of utilizing a relatively bulky housing construction which is exposed to breakage during impacts against the helmet and therefore presents a potential injury hazard to the wearer, only partially mitigated by the fact that the illumination housing is placed at the rear of the helmet.

More generally, non-protective headwear illumination arrangements are also disclosed in a number of prior patents, including U.S. Pat. No. 5,111,366, which discloses an area light for headwear. The illumination arrangement described in this patent utilizes the optical properties of a plastic panel to achieve a desired effect, but while the problem of narrow viewing angle is overcome by providing the optical panel, the structure of the illumination is complex and costly to assemble, and the safety problem is not even considered since this patent is not directed to protective headwear, but rather to a soft cap.

Another prior disclosure of a lighting arrangement for headwear in general is found in U.S. Pat. No. 1,572,210. This patent also does not involve protective headwear, and the lighting arrangement described therein would in fact not be suitable for protective headwear because it involves placement of incandescent glass bulbs on a visor, and therefore a serious risk of injury to the face, head, and brain. In addition, the use of incandescent lighting has the disadvantage of requiring a relatively large power supply.

Similarly, U.S. Pat. No. 4,901,211 describes an illuminated visor structure using unspecified lighting means, but requiring a complicated housing structure which would be both impractical and hazardous to use in any type of headwear intended to serve a protective function.

Finally, British Patent Publication No. UK 0 166 534, and U.S. Pat. Nos. 5,327,587 and 5,426,792 describe lighting arrangements utilizing electro-luminescent lighting elements which, although possessing a number of advantages, are too expensive and use too much power at this time to be widely accepted by consumers in the type of protective headwear applications disclosed herein.

SUMMARY OF THE INVENTION

It is accordingly a first objective of the invention to provide an LED illuminated protective headwear which is mass producible at relatively cost.

It is a second objective of the invention to provide an LED illuminated protective headwear which does not present a hazard to the wearer or to others in the event of an impact.

It is a third objective of the invention to provide an LED illuminated protective headwear which has increased visibility in comparison with conventional LED arrangements.

It is a fourth objective of the invention to provide an LED illuminated protective headwear which is capable of exhibiting a variety of messages or designs and special effects, with relatively low power consumption.

The first three objectives are all achieved, according to a preferred embodiment of the invention, by providing protective headwear in the form of a helmet having at least a hard-shell outer layer and a protective shock absorbing layer with an LED illumination arrangement fitted into recesses in the protective layer and visible through an at least partially transparent area of the hardtop shell in any desired pattern or combination of lighting elements, the illumination arrangement including an optical member which serves to optically increase the viewing angle and at the same time deflect or distribute the force of impacts away from the LED and thereby decrease possible of LED penetration through the helmet and into the head of the wearer.

The fourth objective of the invention is achieved by providing a control circuit in the form of a multiple function integrated circuit controller in which the on/off times and sequences for individual LEDs is switchable, either by means of switches which can be operated by the wearer of the helmet, or during assembly by means of simple circuit components connected to appropriate input pins of the controller, so as to achieve any desired combination of special effects.

The resulting design is capable of meeting all known safety and design standards, including ANSI, ASTM, CSA, and TUV standards, and at the same time provide a product which provides maximum visibility, and safety at a low cost. Although the preferred embodiment of the invention is illustrated as a helmet of the type used by policemen in certain countries, however, it should be appreciated by those skilled in the art that the protective headwear of the invention could also take other forms, such as a bicycle, motorcycle, military, or football helmet, or a hard hat, and that other details of the invention may be similarly varied, for example by substituting a custom integrated circuit for the described commercially available controller, or by varying the manner in which optical effects are achieved. So long as the objectives of simplicity, visibility, and safety are met, the invention is intended to encompass a wide range of modifications and variations.

BRIEF DESCRIPTION OF THE DRAWINGS

FIG. 4 is a perspective view of a third lighting arrangement for the helmet of the preferred embodiment of the invention.

FIG. 4A includes perspective views illustrating principles of the lighting arrangement of FIG. 4.

FIG. 4B is a perspective view of a message element for the lighting arrangement of FIG. 4.

FIG. 5 is an exploded perspective view of a helmet constructed in accordance with the principles of the preferred embodiment of the invention.

FIG. 6 is a perspective view showing details of the protective layer for the helmet illustrated in FIG. 5.

FIG. 10 is a side view of a variation of the protective layer illustrated in FIG. 1.

DETAILED DESCRIPTION OF THE PREFERRED EMBODIMENTS

The preferred embodiment of the invention illustrated herein is in the form of a three-layer helmet made up of two hard-shell layers and a shock absorbing protective layer, as will be described in more detail below. Recesses in the protective layer are arranged to accommodate three different lighting arrangements which share the principles of providing means for diverting the force of impacts from the LEDs and for increasing the visibility of the LEDs. Although the three layers of the helmet and the three different lighting arrangements are described in detail, however, it should be kept in mind that details of the helmet construction and of the lighting arrangements may be varied without departing from the invention, for example by varying the construction, material, or number of layers, by using only one or two of the three lighting arrangements, or by adding different lighting arrangements.

Figure 2:
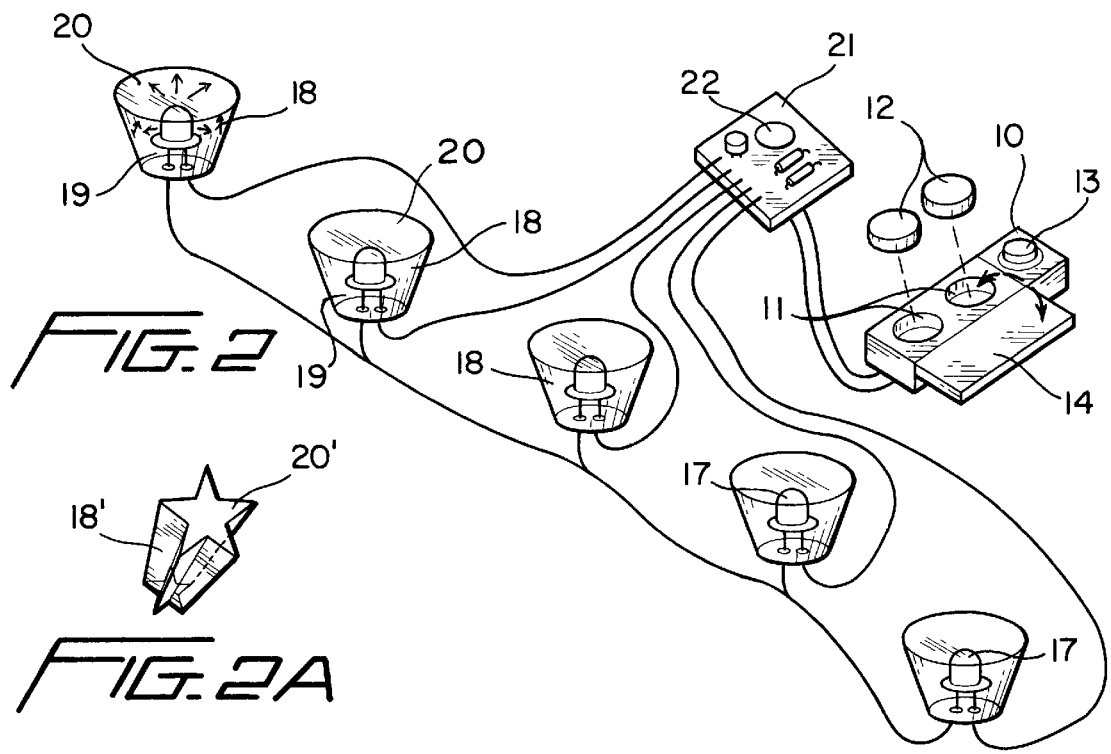
FIG. 2 is a perspective view of a first illumination arrangement for the helmet of the preferred embodiment of the invention.
Figure 3:
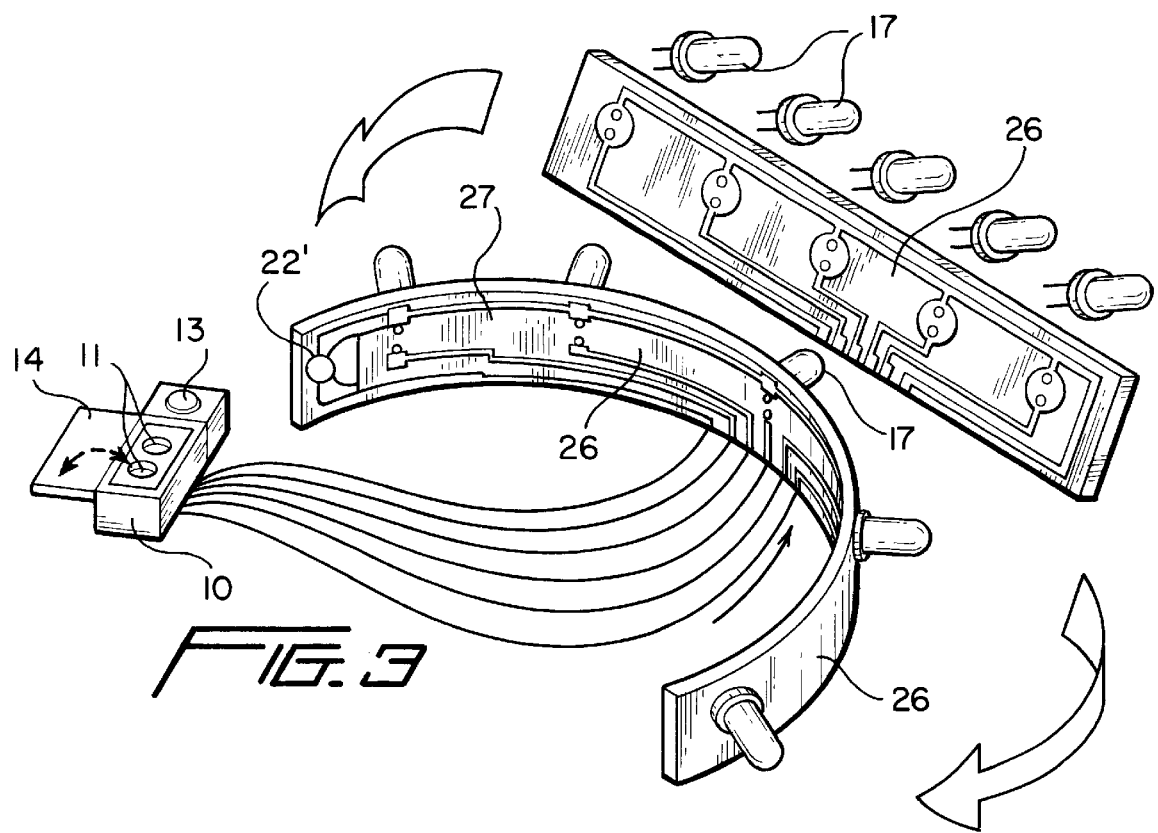
FIG. 3 is a perspective view of a second lighting arrangement for the helmet of the preferred embodiment of the invention.

In the illustrative embodiment of the invention, the above-mentioned three different lighting arrangements illustrated, respectively, in FIGS. 2, 3, and 4, are housed within six different types of recesses, indicated by reference numerals 2–8, in the protective shock absorbing layer 1 of the preferred helmet. The recesses can either be molded into the protective layer, for example in the case of a layer made of an injection molded plastic or foam material, or formed later, depending on the construction and material of the protective layer itself. Except for the presence of the illustrated recesses, the protective layer may be entirely conventional in nature.

The six different types of recesses are:

1.) a recess 2 at the front of the helmet for accommodating a switch and battery housing;
2.) a recess 3 for accommodating an integrated circuit controller;
3.) a plurality of generally frustoconical recesses 4 for accommodating the lighting arrangement illustrated in FIG. 2;
4.) a recess formed from three communicating sections, including a common parallelpiped shaped section 5, slot shaped sections 6; and sections 7 for accomodating the lighting arrangement illustrated in FIG. 3;
5.) a parallelpiped shaped recess 8 for accommodating the lighting arrangement illustrated in FIG. 4; and
6.) channel-shaped recesses 9 for accommodating wires connecting the respective lighting arrangements with the control circuit, power pack, and switch.

The power pack used in the preferred embodiment, which is shared by the illumination arrangements illustrated in FIGS. 2, 3, and 4, but is illustrated only in FIGS. 2 and 3, includes a housing 10 mounted in recess 2. Housing 10 preferably includes one or more compartments 11 for accommodating one or more batteries 12, illustrated in FIG. 2 as button-type batteries which are preferred because of their relatively small dimensions, electrical contacts (not shown), an on/off switch 13, and an access door 14. The access door and switch are accessible to someone wearing the helmet though an opening 15 in the front portion of the innermost or lower hard-shell layer 16 of the helmet, shown in FIG. 5. Preferably, for safety reasons, the housing and switch are located under a test line of the helmet.

The first of the three different lighting arrangements used in the exemplary helmet, which is illustrated in FIGS. 2 and 2A–2C, is made up of a plurality of LEDs 17 each housed in an individual optical device 18, which in turn is positioned in one of the recesses 4 and electrically connected by wires to a circuit board 21 positioned in recess 3 and including thereon a controller 22. A preferred integrated circuit controller and other components on the circuit board are described in greater detail in connection with FIGS. 8 and 8A–8I, although those skilled in the art will appreciate that the controller 22 may be implemented by circuits other than the integrated circuits illustrated in FIGS. 8 and 8A–8I.

As illustrated in FIG. 2, the optical devices 18 are formed by a transparent member having a frustoconical or paraboloid shaped surface 19 arranged to reflect light emitted by the LED contained therein over a desired viewing angle, effectively magnifying the image of the LED, and at the same time to protect the LED contained therein and prevent it from being driven through the protective layer 1 of the helmet upon impact.

As will be appreciated by those skilled in the art, the optical devices can be formed to significantly increase both the viewing angle and the intensity of light exiting the optical device through surface 20, with the increase in viewing angle or magnification of the LED image being a function of the shape of the reflective surface, and the increase in intensity being the result of directing all of the light emitted by the LED through the surface 20. The protective effect of the optical devices 18 is also the result of the shape of the optical device, and of the recess 4 in which it is place, with the wider opening causing the force of an impact to be spread out over a larger area of the protective layer 1 around the recess 4.

The reflective material can be in the form a reflective layer or coating on all surfaces of the optical device 18 except for the front surface through which the light exits, although the reflective coating could also be applied to the surfaces of recesses 4, or a foil or other reflective material to be separately applied to the optical device or recess. In addition, those skilled in the art will appreciate that if maximum light intensity is not desired, optical principles other than or in addition to reflection could be used to achieve a desired effect, for example by adding a diffraction grating to surface 20 of the optical device, or by making the optical device of a translucent or light diffusive material. In addition, those skilled in the art will appreciate that the optical device could be made of a colored material, to expand the range of possible colors displayable by the preferred illumination arrangements.

Figure 2A:
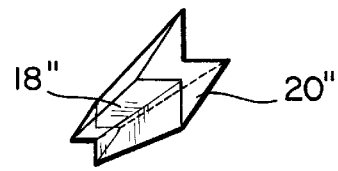
FIGS. 2A–2C are perspective views of variations of optical devices for use in the illumination arrangement illustrated in FIG. 2.
Figures 2B, 2C:
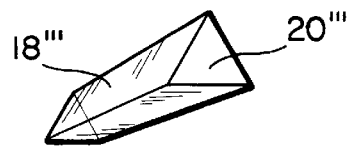

Also, as illustrated in FIGS. 2A–2C the optical devices 18', 18', and 18''' having light exit surfaces 20', 20', and 20''' can have a variety of shapes other than frustoconical or hemispherical, including star shaped, as illustrated in FIG. 2A, lightning shaped as illustrated in FIG. 2B, or triangular as illustrated in FIG. 2C. In each case, the cross-sectional area of the device is preferably larger at the outer surface than at the inner surface to present a wider angle for viewing and to prevent the device from being driven into the protective layer upon impact.

Figure 7:
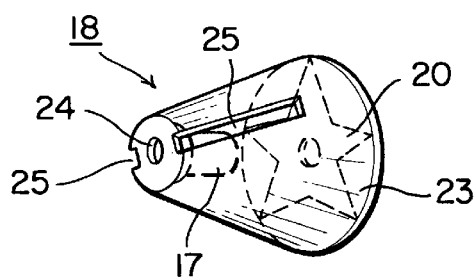
FIG. 7 is a perspective view showing a variation of the optical devices illustrated in FIG. 3.
Figures 7A, 7B:
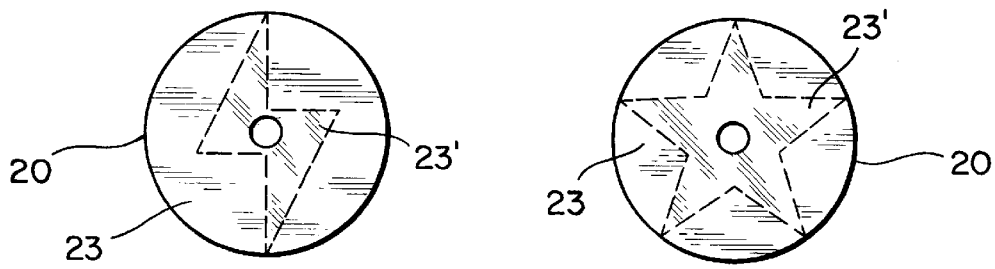
FIGS. 7A–7B are plan view showing variations of the device illustrated in FIG. 7.

Additional details of the construction of optical devices 18 are shown in FIGS. 7, 7A, and 7B. The optical devices, which are illustrated in these Figures as being frustoconical in shape, but which could have any of the shapes illustrated in FIGS. 2A and 2B, as well as numerous other shapes, is formed of a molded plastic material with a white or metalized inner surface to reflect light from the LED through the wide end of the structure. As illustrated in these figures, surface 20 is only partially transparent with the opaque areas being fused to form designs without the need for changing the shapes of the devices as in the variations of FIGS. 2A and 2B. In the version illustrated in FIG. 7, the LED is inserted through the wide end of the structure such that the leads of the LED extend through an opening 24 at the bottom of the structure and into grooves 25 formed along the sides of the structure, where the leads can, for example, be affixed by soldering. The designs formed by the respective opaque areas 23 and transparent areas 23' of the surface 20 can of course be varied to form any desired pattern, as suggested by FIGS. 7A and 7B.

Figure 3A:
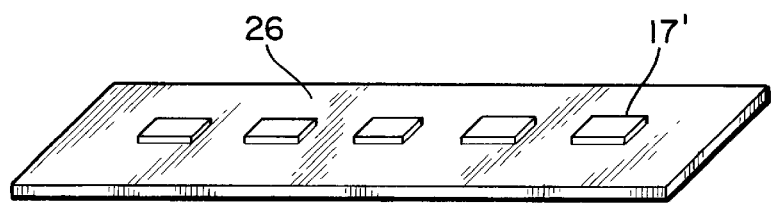
FIGS. 3A and 3B are perspective views of variations of the illumination arrangement illustrated in FIG. 3.
Figure 3B:
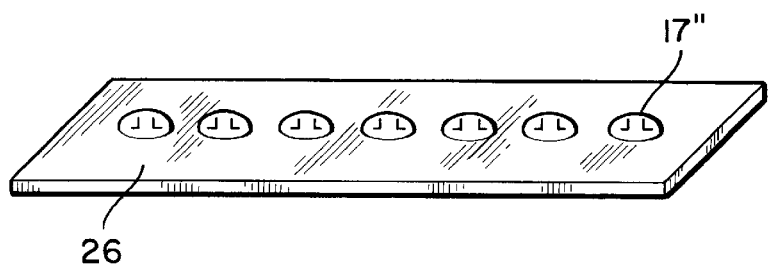

The second lighting arrangement, illustrated in FIGS. 3, 3A, and 3B, fits within the recess formed by communicating sections 5–7, and provides greater impact protection than does the first lighting arrangement because any impacts are distributed by a flexible circuit board 26 to which the LEDs are attached. The flexible circuit board is positioned within parallelpiped shaped recess section 5, with the LEDs 17 for this embodiment extending through slot shaped section 6 and into sections 6 sections 7. Sections 7 in this embodiment may have a frustoconical or paraboloid shape, so that individual optical devices (not shown) corresponding to optical devices 18 can be placed therein.

Because in this embodiment the LEDs are connected by traces 27 on the circuit board 28, it will be appreciated by those skilled in the art that a separate integrated circuit controller 22' for the five illustrated LEDs 17 could be mounted directly on the circuit board rather than being located in the recess 3. This works out well because the commercially available integrated circuit controller has five output pins, and thus the second lighting arrangement can conveniently be controlled separately from the first lighting arrangement, with a direct wiring connection to the power pack. In addition, this arrangement permits a variety of LED types to be used, including LEDs embedded in the circuit board and LEDs of different shapes, two different examples 17' and 17' of which are illustrated in FIGS. 3A and 3B.

The third arrangement, illustrated in FIGS. 4, 4A, and 4B, involves an alternative optical device 28 arranged to fit into one of the shallow parallelpiped shaped recesses 8 in protective layer 1. In this arrangement, the optical device is in the form of a generally planar sheet of transparent material in which are formed designs arranged to direct light initially travelling within the sheet at a desired angle out of the plane of the sheet so that the design becomes visible. The design is created by engraving, molding, or otherwise forming in the sheet ditches or grooves 29 having angled sides 30 and 31 which refract and or reflect light incident at an appropriate angle. The LEDs 17 in this arrangement are fitted into slots 32 at the edges of the device, as a result of the which this arrangement has a minimum thickness and maximum are of coverage. The thinness of the arrangement allows the arrangement to placed at areas where there is a high likelihood of impact without affecting the structural integrity of the protective layer. As with the other two illumination arrangements, this illumination arrangement can accommodate different shapes and sizes of LED, for example a rectangular LED 17', simply by varying the shape of the slots 32, for example by squaring off the slots to form a slot 32'.

Figure 1:
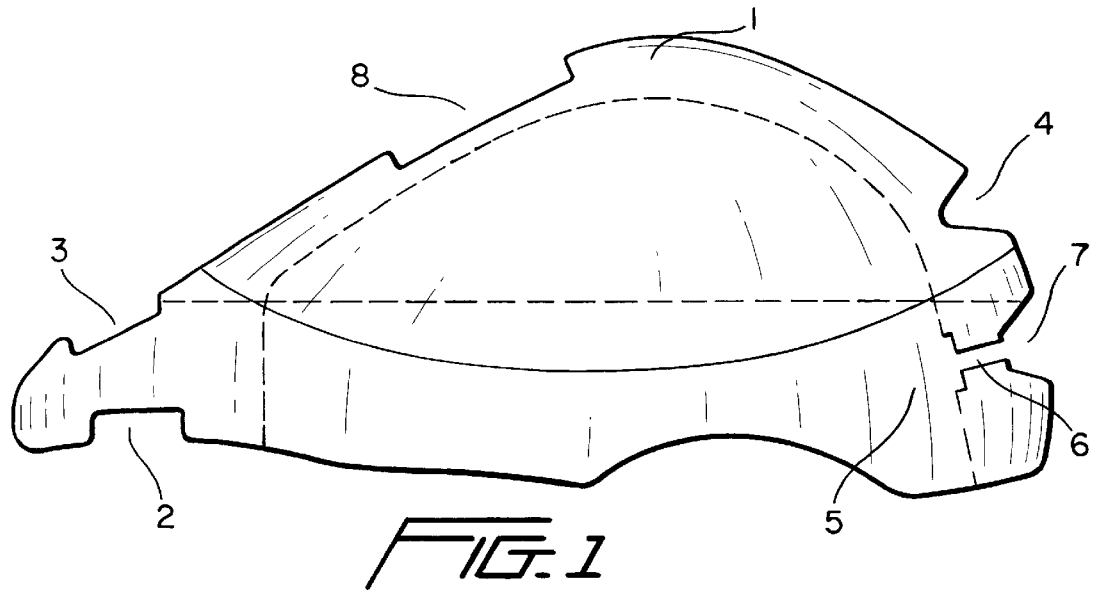
FIG. 1 is a side view of a protective layer for a helmet constructed in accordance with the principles of a preferred embodiment of the invention.

The complete helmet structure, as illustrated in FIGS. 5 and 6, includes upper and lower hard-shell layers 16 and 33, as well as the protective layer 1 in which the lighting arrangement recesses 2–8 are formed. The protective layer illustrated in FIG. 5 is the same as that illustrated in FIG. 1 except that certain additional conventional structural features, such as ventilation openings 34, are also illustrated in addition to recesses 2–8.

The upper hard shell layer 33, as shown in FIG. 5, includes a plurality of transparent areas 35 through which the lighting elements of the first lighting arrangement, i.e., the lighting arrangement illustrated in FIGS. 2 and 7 are visible, as well as transparent areas 36 through which the third lighting arrangement illustrated in FIG. 4 is visible (the area of the second lighting arrangement is not covered by the hard-shell).

It will be appreciated that the lower hardshell can also include transparent areas, particularly if it extends along the front of the protective layer, for example for the purpose of forming a reading light for a wearer of the helmet, as illustrated in FIGS. 11 and 12.

In order to provide a greater variety of special effects, and also as a power saving measure, it is preferred that the control circuit include an integrated circuit. Examples of a suitable integrated circuit controller include Maintech Semiconductor Inc.'s model No. MT-L5x/MT-L61/MT-L62 series circuits, each of which is capable of flashing the LEDs at 0.1 second intervals, which is sufficient to provide a persistence of vision effect and give the illusion of continuous illumination while reducing power consumption.

Figure 8:
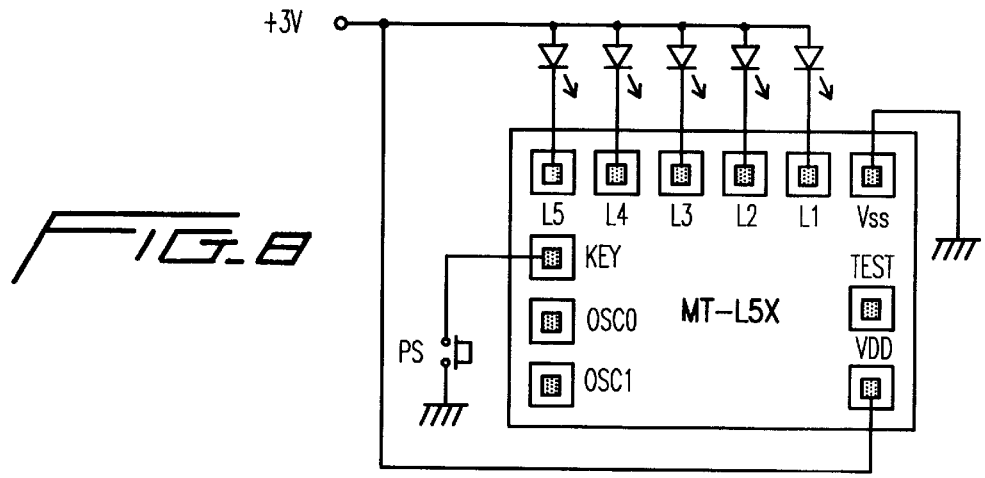
FIG. 8 is a schematic diagram of an integrated circuit suitable for use as a controller for the illuminated wheel of the preferred embodiment of the invention.
Figures 8E, 8F:
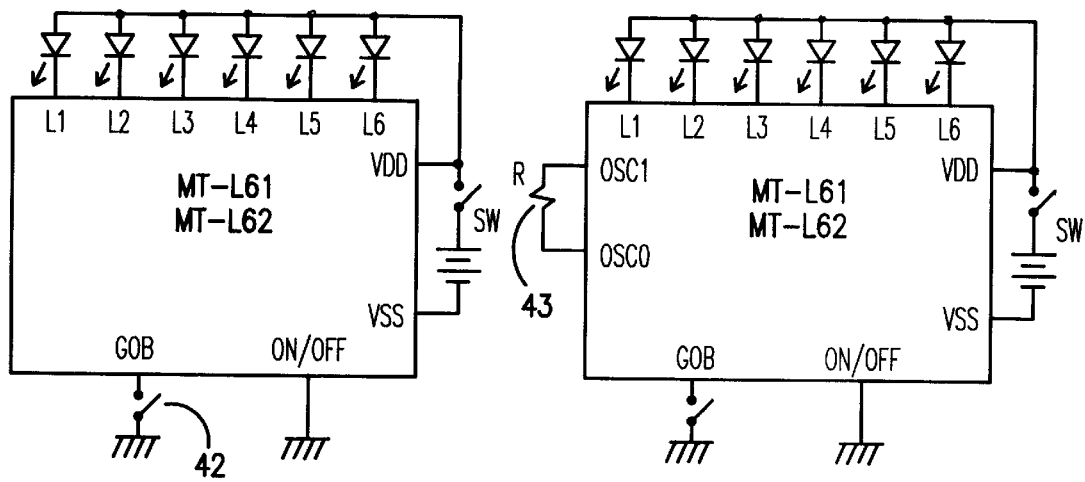
FIGS. 8A–8H show various connections for an alternative controller arrangement for the illuminated wheel of the preferred embodiment of the invention.
Figures 8G, 8H:
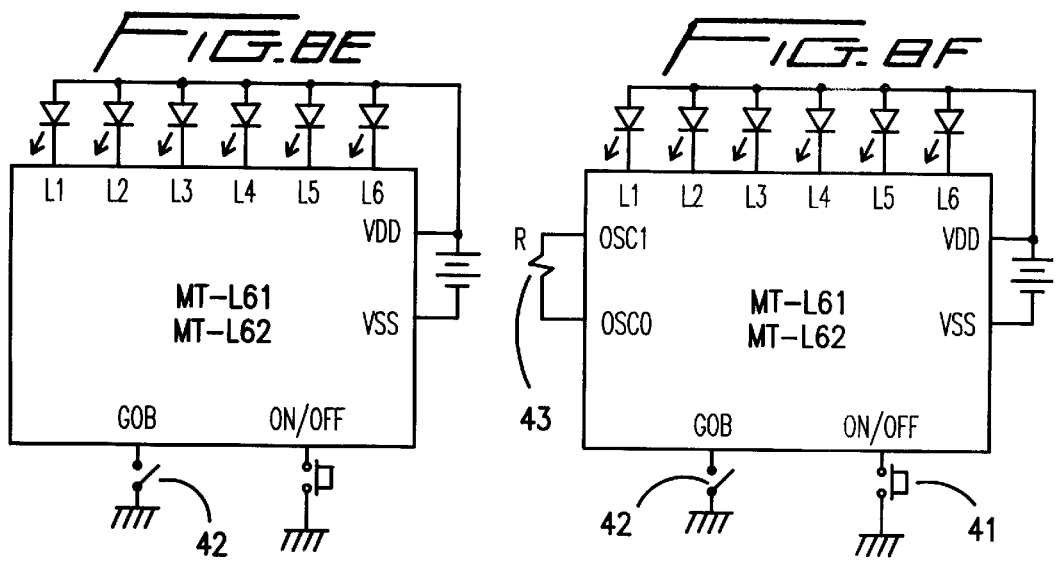
Figure 8A:
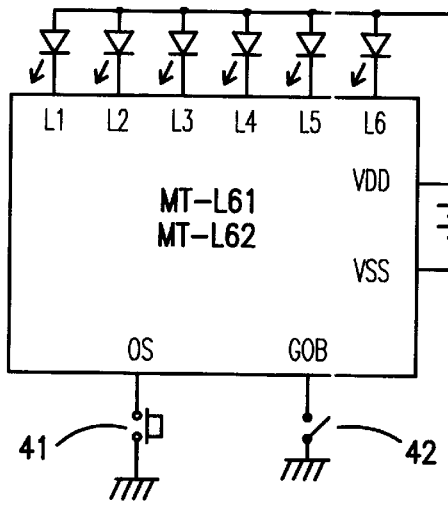
Figure 8B:
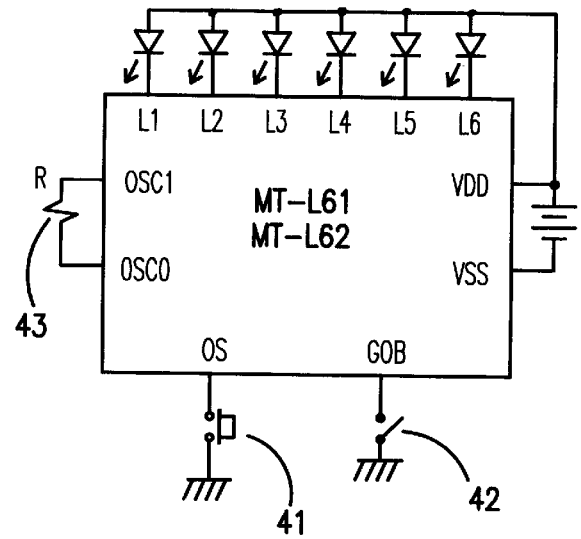
Figure 8C:
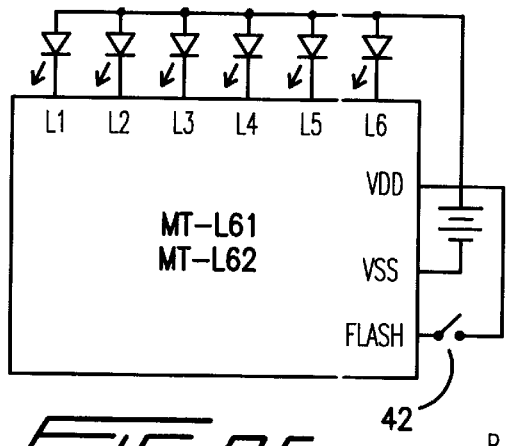
Figure 8D:
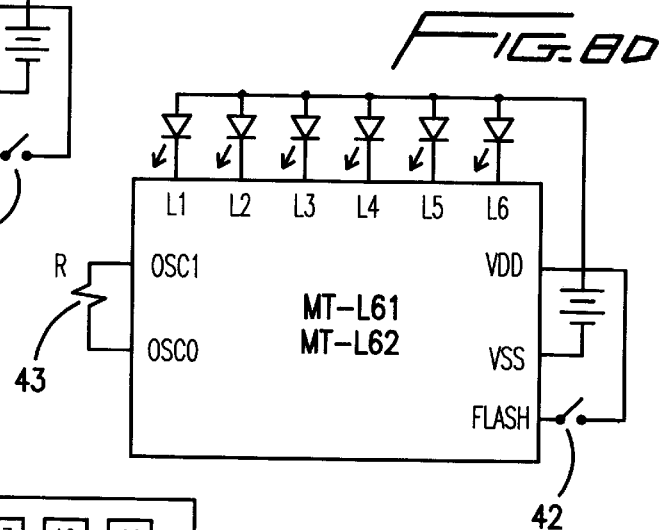
Figure 8I:
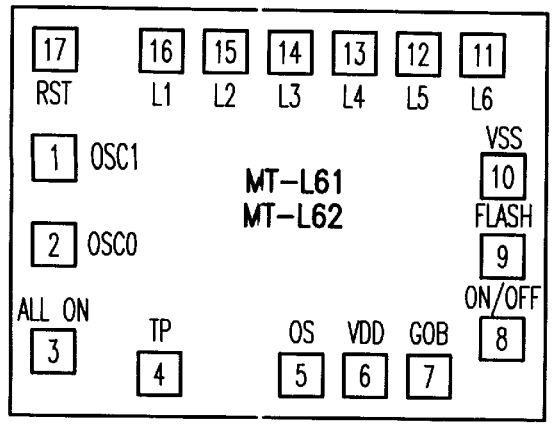
FIG. 8I illustrates an alternative integrated circuit for use with the lighting arrangement of the preferred embodiment of the invention.

The terminal or pin layout of the Maintech MT-L5x series controller is illustrated in FIG. 8, while various arrangements of the Maintech MT-L61/62 series integrated circuits are illustrated in FIGS. 8A–8H, and the pin or terminal layout of the L61/62 series controllers are illustrated in FIG. 8I. The MT-L5X series controller uses CMOS technology to provide on/off control of five LEDs, with a working voltage of 2.0–5.0VDC and a static power drain of 5 $\mu$A, all functions being controlled by a 4-way function switch which provides flashing and steady state activation at a rate determined by the voltage at the terminals of an on-board oscillator. The L61/62 series integrated circuits are similar, but provide control for six LEDs, with various triggering options as shown in FIGS. 8A–8H, including the possibility of automatic triggering by, for example, a motion sensor switch 41 and/or a manual on/off switch 42, the flash rate being determined by the presence or absence of a resistor 43 in the oscillator circuit.

As illustrated in FIG. 8I, the size of the integrated circuit illustrated in FIGS. 8A–8H is 1660 $\mu$m by 1600 $\mu$m, with the integrated circuit of FIG. 8 being significantly smaller. In either case, the chip size is well-within the available footprint for applications of the type noted above. The terminal assignments illustrated in FIG. 8I (and FIG. 8) are as follows: OSCI is an oscillator input terminal, OSC0 is an oscillator output terminal; ALLON produces a steady state output for all LEDs; TP is an internal test pin; OS serves as a trigger for LED control pin 16, VDD is the positive voltage input; GOB initiates a chasing or scanning effect; ON/OFF can be used to flash LEDs on command or in response to external events; FLASH causes all of the LEDs to flash; VSS is the negative voltage input; L1–L6 are LED control pins, and RST carries out a variety of different functions depending on the initially selected function.

As indicated above, those skilled in the art will appreciate that flashing of the LEDs can be used not only to create special effects, but also to lower the power consumption of the illumination arrangement, even in the case where a steady illumination is desired, in which case the flashing need only occur at above the frequency of human perception. Obviously, additional effects can be obtained by adding a photosensor or motion sensitive switch.

For practical applications, the LED illuminated protective helmet of the preferred embodiment not only offers the possibility of displaying messages or other designs, but can also provide a headlight or reading light. Because the multi-functional integrated circuit is capable of performing a variety of functions, the lights can be switched from a message display to a steady on as desired. The headlight or reading function can be enhanced by using high brightness LEDs such as the 10 candlepower white LEDs manufactured by Toshiba corporation, to provide different brightness grades in a single arrangement, in which case it may be desirable to provide more than one switch to control the different lighting arrangements.

Those skilled in the art will of course appreciate that while an especially preferred controller circuit has been described in detail, other dedicated or programmable LED controllers may be substituted for the illustrated controller integrated circuits, and that the above description is not intended to be limiting.

An example of a completed helmet constructed in accordance with the principles described above is illustrated in FIG. 9. It can be seen from this Figure that the various lighting arrangements perform different functions, with the first lighting arrangement being arranged in the manner described above, for example, to display stars, either as a result of the shape of the optical devices or because of opaque printing on the devices, and to turn on and off sequentially for a scanning or chasing effect, a second lighting arrangement (indicated by the reference numeral 36') being arranged, for example, to flash and form the letters of the word "police," and a third lighting arrangement being arranged in the above described manner to display a steady state message.

Figure 9:
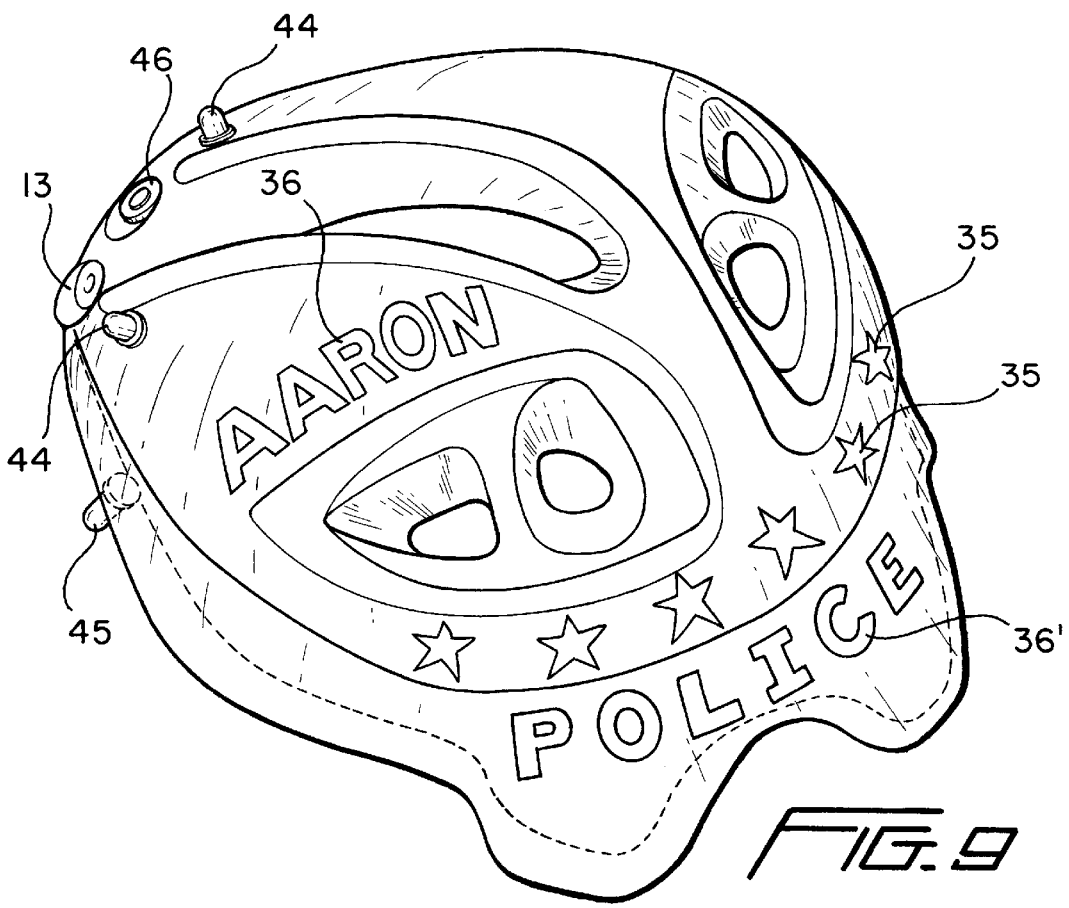
FIG. 9 is a perspective view of an assembled version of the helmet illustrated in FIG. 6.

In addition, LEDs may be added to form a group of touch lights 44 and a group of reading lights 45, the latter being controlled by a separate on/off switch 46, with the two additional groups being situated in respective recesses 47 and 48, as illustrated in FIGS. 9 and 10. Finally, those skilled in the art will appreciate that individual elements in the different groups or lighting arrangements, or the different groups and lighting arrangements as a whole, can be arranged to use different colored LEDs or to have different colored optical elements and or optical effects.

In addition to providing impact distribution and protection of the wearer from the otherwise dangerous LEDs and increasing the viewing angle of the LEDs and apparent brightness, the recessed lighting arrangement of the invention also provides a smooth helmet surface, which can be achieved by either forming or molding transparent members into the helmet hard-shell or by forming a completely transparent hard-shell and painting the shell to form the desired "windows."

Having thus described various preferred embodiments of the invention, those skilled in the art will appreciate that variations and modifications of the preferred embodiment may be made without departing from the scope of the invention. For example, a measure of protection could be achieved by simply orienting the LEDs so that the long dimension is parallel to the surface of the wearer's head. It is accordingly intended that the invention not be limited by the above description or accompanying drawings, but that it be defined solely in accordance with the appended claims.

We claim:

1. Illuminated protective headwear, comprising;
   at least one impact absorbing protective layer;
   recesses in the protective layer; and
   the following elements positioned in the recesses:
      at least one LED positioned substantially entirely within one of said recesses;
      at least one impact distributing optical device positioned substantially entirely within said one of said recesses to protect the LED from impacts, said optical device including means having optical properties for increasing visibility of the LED;
      a power source;
      a control circuit; and
      means for electrically interconnecting the LED, power source, and control circuit.

2. Headwear as claimed in claim 1, further comprising a hardshell layer having means defining transparent areas through which light transmitted by the LED is visible.

3. Headwear as claimed in claim 1, wherein said optical device is arranged to increase a viewing angle of the LED.

4. Headwear as claimed in claim 1, wherein the optical device is arranged to magnify an image of the LED.

5. Headwear as claimed in claim 1, wherein said optical device includes a transparent portion having a surface through which light emitted by the LED passes to an observer, and wherein the optical device further includes an inwardly facing layer of reflective material arranged to direct light emitted by the LED through said transparent portion and through said surface.

6. Headwear as claimed in claim 5, wherein said surface through which the light from the LED is directed includes both transparent and opaque areas.

7. Headwear as claimed in claim 5, wherein a cross-section of the optical device increases towards said surface.

8. Headwear as claimed in claim 7, wherein said optical device has a frustoconical shape.

9. Headwear as claimed in claim 1, wherein said optical device is made from injection molded transparent plastic arranged to hold the LED at a desired location.

10. Headwear as claimed in claim 1, further comprising a second LED, and wherein the first and second LEDs are mounted on a flexible printed circuit board positioned in a section of said one of said recesses.

11. Headwear as claimed in claim 1, wherein said power source is contained in a housing having an access door arranged to permit replacement of the power source, and further comprising an on/off switch accessible to a wearer of the headwear, said housing and switch being located under a test line of the headwear.

12. Headwear as claimed in claim 11, wherein said planar member includes a plurality of notches for a plurality of LEDs, and wherein said groove forms a message.

13. Illuminated protective headwear, comprising:
at least one impact absorbing protective layer;
recesses in the protective layer; and
the following elements positioned in the recesses:
    a plurality of groups of LEDs, each of the plurality of groups including a plurality of LEDs positioned substantially entirely within at least one of said recesses;
    respective impact distributing optical devices positioned substantially entirely within at least one of said recesses in which at least one of said LEDs is positioned to protect said at least one of said LEDs from impacts, said optical devices including means having optical properties for increasing visibility of the LEDs in at least one of the groups;
    a power source;
    a plurality of switches, one of said switches being for switching on and off each of the LEDs in one of said groups, and another of said switches being for switching on and off each of the LEDs in another of said groups;
    at least one control circuit;
    means for electrically interconnecting the LEDs, switches, power source, and control circuit.

14. Headwear as claimed in claim 13, wherein one of said plurality of groups has a first function and a second of said plurality of groups has a second function.

15. Headwear as claimed in claim 13, wherein one of said groups includes LEDs of a first type and another of said groups includes LEDs of a different type.

16. Headwear as claimed in claim 13, wherein said groups are situated at different locations on the headwear and have different viewing angles.

17. Headwear as claimed in claim 13, where said groups are connected in parallel to the power source and control circuit.

18. Headwear as claimed in claim 13, wherein said optical device includes a reflective surface arranged to increase a visibility of the LEDs in at least one of the groups.

19. Headwear as claimed in claim 18, wherein said reflective surface is a metalized surface.

20. Headwear as claimed in claim 13, further comprising a smooth outer hardshell layer through which the LEDs in at least one of the groups are visible.

* * * * *